United States Patent [19]
Kamakura et al.

[11] Patent Number: 5,578,156
[45] Date of Patent: Nov. 26, 1996

[54] METHOD OF MOUNTING A LENS ON A LIGHT EMITTING DIODE

[75] Inventors: Mitsutoshi Kamakura; Hiroichi Murakami, both of Osaka; Hiroyuki Ishii; Masayuki Nishikawa, both of Hyogo, all of Japan

[73] Assignee: Sumitomo Electric Industries, Ltd., Osaka, Japan

[21] Appl. No.: 250,625

[22] Filed: May 27, 1994

[30]    Foreign Application Priority Data

Jan. 7, 1994   [JP]   Japan ................... 6-012121

[51] Int. Cl.⁶ ................................... B32B 31/28
[52] U.S. Cl. ..................... 156/275.5; 156/272.2; 156/275.7; 156/378; 156/64; 362/800; 382/288; 382/272
[58] Field of Search .................. 156/272.2, 275.5, 156/275.7, 378, 379, 64, 273.9, 379.8; 362/800; 437/127; 382/288, 272, 181, 192, 194

[56]          References Cited

U.S. PATENT DOCUMENTS

| | | | |
|---|---|---|---|
| 3,834,966 | 9/1974 | Kelly | 156/379 |
| 4,501,637 | 2/1985 | Mitchell et al. | . |
| 4,610,746 | 9/1986 | Broer et al. | 156/275.7 X |
| 4,647,331 | 3/1987 | Koury, Jr. et al. | 156/275.5 X |
| 5,403,773 | 4/1995 | Nitta et al. | 437/127 X |

FOREIGN PATENT DOCUMENTS

| | | |
|---|---|---|
| 0269337 | 6/1988 | European Pat. Off. . |
| 57-29067 | 6/1982 | Japan . |
| 58-93716 | 6/1983 | Japan . |
| 60-161684 | 8/1985 | Japan . |
| 2035595 | 6/1980 | United Kingdom . |
| 2047917 | 12/1980 | United Kingdom ............. 156/275.7 |

OTHER PUBLICATIONS

Patent Abstracts of Japan, vol. 9, No. 113 (P–356) May 17, 1985 & JP–A–60 000 413 (Sumitomo Denki Kogyo KK) Jan. 5, 1985.
Patent Abstracts of Japan, vol. 9, No. 332 (E–370) Dec. 26, 1985 & JP–A–60 161 684 (Sumitomo Denki Kogyo KK) Aug. 23, 1985.

Primary Examiner—David A. Simmons
Assistant Examiner—Steven J. Helmer
Attorney, Agent, or Firm—Cushman, Darby & Cushman, L.L.P.

[57]          ABSTRACT

A rear surface emission type light emitting diode emits light beams produced at a narrow emanating region out of the rear surface of the substrate. Preferably a device chip should be directly equipped with a lens on the rear surface. A plurality of light emitting devices with a package are laid on an XY-stage which can move in an XY-plane. A camera, a dispenser and a vacuum collet can transfer in Z-direction. The distances and the directions among the camera, the dispenser and the collet are predetermined values. The chip is actually examined by letting it emit light beams from the emanating region. The light is observed by the camera to obtain light power distribution on individual pixels. From the light power, the center of the emanating region is determined. The XY-stage is displaced till the center of the emanating region coincides with the center of the camera. Then the XY-stage is moved by the predetermined distance to send the chip just beneath the dispenser. The dispenser comes into contact with the chip and supplies ultraviolet resin to the chip. The XY-stage is again displaced by the predetermined distance to feed the chip below the vacuum collet holding a lens. The collet brings the lens in the resin on the surface till the lens touches the surface. Ultraviolet rays are cast on the ultraviolet hardening resin to stiffen the resin.

11 Claims, 12 Drawing Sheets

METHOD OF MOUNTING A LENS ON A LIGHT EMITTING DIODE

BACKGROUND OF THE INVENTION

This application claims the priority of Japanese Patent Application No. 12121/1994 filed Jan. 7, 1994, which is incorporated herein by reference.

This invention relates to a method and an apparatus of mounting a lens on a semiconductor light emitting device which is used as a light source in optoelectronic communications. Laser diodes and light emitting diodes are typical semiconductor light emitting devices. From the standpoint of material of substrate, the semiconductor devices are classified into a GaAs type, a GaP type, or an InP type. These semiconductor devices emit light beams with different wavelengths, because each material has a different inherent band gaps. The light emitting devices are also classified into two types by the configuration of emitting light beams. One is a surface-emission type which emits light perpendicular to a surface of films or a substrate. The other is a side emission type which propagates light in a waveguide parallel with a surface and emits light from a side end.

This invention aims at an improvement of the surface-emission type of light emitting device. Surface-emission type devices emanate light beams perpendicular to an interface of layered films (pn junction). Some emit light beams from a film surface. Others emit light from a substrate surface. In order to distinguish two types, the device emanating from the film surface is temporarily called a front surface emission type and the other device emitting from the substrate surface is now called a rear surface emission type. Light beams diverge in all directions from a narrow active region without being guided by a waveguide. Strong divergence of beams allows little part of the beams to enter an end of an optical fiber. Thus most of the surface emission type devices employ a lens for converging light beams and for introducing the beams into a core of a fiber.

Optoelectronic communications or optoelectronic measurements require small cores in fibers, because single-mode waves are preferable for transmitting a signal for a long distance without deformation or transmitting only one mode of signal. Prior devices have adopting ball lenses for gathering beams efficiently. A ball hens is favored with the shortness of a focal distance and isotropy. The short focal length effectively gathers light beams. Geometric isotropy facilitates the mount of a lens on a semiconductor device. Ball lenses are directly fixed on a light emitting device without space. The short focal length forbids the ball lens separating from the light emitting device. A lens has been fixed directly on a device. The surface-emission type installs a ball lens directly on a chip of a device without space or any spacer for gathering light beams effectively. The mount of a lens does not mean such an indirect coupling of bonding a chip on a package and encapsulating the package with a cylindrical cap having a lens at a window. Such a package and a lens-cap may be employed to seal the device at a later stage in order to fabricate double lens devices. The lens mount of this invention relates only to the direct coupling of a lens to a chip.

PRIOR ART

Various ways have been proposed in order to fix a lens on a light emitting device. Narrow core of an optical fiber and wide divergence of light beams emanating from an active region demand a precise positioning of a lens. A little deviation from the optimum spot greatly reduces the power of the light entering the fiber core.

Japanese Patent Publication No. 57-29067 (29067/'82) digs a circular cavity on a chip above the active (emanating) region for positioning a lens. A semiconductor wafer is provided lengthwise and crosswise with a lot of units comprising an emanating (active) region and a set of electrodes. Cavities arc formed either on the front surface or the rear surface in correspondence to the positions of the emanating regions. Then the wafer is cut lengthwise and crosswise into lots of individual devices. The separated ones are chips which contain a set of parts of a semiconductor device. The chip is fitted to a suitable jig.

Since then, the processes for individual chips begin instead of the wafer processes. Individual chips are treated by the steps of filling an adhesive in the cavity, supplying a ball lens into the cavity till the lens comes into contact with the verge of the cavity, bringing the chip into a furnace, and heating the adhesive to harden in order to fix the lens. The adhesive is a material which is hardened by heating. Since the cavities are dug by photolithography, the cavities are exactly positioned with regard to the emanating regions. Furthermore, since the ball lens is circumscribed with the verge of the cavity, the lens is positioned to the cavity with high accuracy. If the light beams launch from the epitaxial surface (front surface emission type), the relative position of the cavity to the emanating region is rigorously determined, because a series of photolithographic processes are commonly applied to the same front surface.

However, this method is impotent to position a cavity with regard to the emanating region exactly for the rear surface emission type device which emits light from the substrate instead of from the epitaxial layer. Emanating regions are made by selective doping of impurity from the front surface of a wafer with the aid of photolithography. Then the wafer is turned upside down. The cavities must be dug on the rear surface by photolithography. Deformation, bend or misorientation of the wafer incurs errors in positioning cavities themselves. Bilateral wafer processes greatly injure the preciseness of positioning of the cavities to the emanating regions.

Another drawback is the stay of adhesive in cavities. Since lenses are fitted in the cavities, after the cavities are filled with the adhesive, some adhesive sometimes remains above the verge of the cavities without being fully excluded owing to the insufficient pressure of the lenses and the strong viscosity. Then lenses float above the cavities without being circumscribed. The float of lenses on the adhesive invites misalignments of lenses both in the vertical direction and in horizontal directions. The displacement of lens from the regular spot reduces the power of light which converges on a core of a fiber which is positioned at a predetermined place. Big deviation of lens in horizontal directions will completely forbid the light entering the fiber.

Japanese Patent Laying Open NO. 60-161684 aims to solve the difficulty of the incomplete exclusion of adhesive out of cavities. Instead of digging circular cavities, the improvement forms sets of plural protrusions either on the front surface or the rear surface of a wafer. The center of the set of the protrusions coincides with the center of the emanating region in the vertical direction. Namely, a set of protrusions are formed at the spots which are rotationally symmetric around a normal standing at the center of the emanating region. The method paints an adhesive on the centers of the sets of protrusions, supplies ball lenses to the centers of the protrusions, and fixes the lenses at the centers by the adhesive. The lens contacts with the protrusions at the sides. The protrusions exactly position the ball lens at a suitable spot. Extra adhesive will be excluded through the wide gaps between the protrusions. Sufficient exclusion of the adhesive seems to prohibit the ball lens from floating above the surface. However, it is wrong. The force of a lens to exclude an adhesive is in proportion to the weight of the lens, because the lens presses the adhesive by its gravity. The ball lens is small and light. The gravity of the lens is so small that some extra adhesive still remains at the center of the protrusions. For example, a ball lens of a 300 μm diameter weighs only about 0.00001 g (10 μg). When the ball lens is placed on fluid adhesive, the ball lens slowly sinks in the adhesive. It takes a long time for the lens to descend to the surface of the semiconductor. Sometimes the adhesive hardens, before the lens attains the surface. Then the lens is fixed at a point separated from the surface.

In both cases of digging a cavity or forming protrusions, the front emission type enables the wafer processes to harmonize the center of the cavity or the set of protrusions with the center of the emanating region with precision. However, the rear surface emission type includes the wafer processes on both surfaces. At first the emanating regions are formed by epitaxy, impurity doping and photolithography of the front surface. Then the wafer is turned upside down. The cavities or protrusions are produced on the rear surface by photolithography and etching. It is not easy to make the center of the cavities or protrusions coincide with the center of the emanating regions in the direction normal to the surface. If the positioning is not correct, the center of the emanating region deviates from the center of the cavity or the set of protrusions. The ball lens gathers the light beams emitted in various directions from the emanating region also in the deviating case. But the lens does not converge the beams on the core of a fiber. Almost all beams deviate from the fiber. The deviation of the convergence prevents sufficient power of beams from entering the fiber and weakens the coupling between the light emitting device and the fiber. The ill coupling is liable to induce malfunction due to the insufficient power of light.

Here the names of surfaces are defined to avoid confusion. Till now, the bottom of the substrate has been called a rear surface and the top layer among epitaxially-grown layers has been called a front surface. The front surface is the surface nearer to the emanating region. This invention aims at an improvement of the rear surface emission type of light emitting device. Then the bottom surface of the substrate is called a main surface or a rear surface. The epitaxial surface is called a sub-surface or a front surface. Three dimensional coordinates are also defined now. X-axis and Y-axis lie in the surface. Thus the front surface and the rear surface are one of XY- planes. Z-axis is a normal of the surfaces.

The selection of the emission surface depends on the wavelength of the generated beams. The GaAs type device having a GaAs substrate and AlGaAs epitaxial layers emits light beans of a 0.85 μm wavelength. The GaAs of the substrate absorbs the light of this wavelength. Thus the light beams cannot pass through the substrate. The beans go out from the epitaxial layer surface. Therefore, the GaAs light emitting devices belong to the front surface emission type.

The InP type device having an InP substrate and InGaAsP epitaxial layers emits light of a wavelength of 1.3 μm. The InP is transparent to the light of a 1.3 μm wavelength. The light beams can be taken out from the substrate. InGaAsP is also transparent to the light of a 1.3 μm wavelength. The light beams can go out from the epitaxial layers. Therefore, the InP light emitting device can be fabricated both into the front surface emission type and the rear surface emission type. As mentioned before, this invention alms at an improvement of the rear surface emission type device.

A light emitting device for optoelectronic communications has a narrow emanating region. The optical fiber to be connected to the device has a very narrow core. Single-mode fibers have a core of a diameter of about 5 μm to 7 μm. Graded-index fibers have a core of a diameter of around 50 μm to 62 μm. Efficient coupling of a light emitting device to a lens demands a rigorous positioning of a ball lens in the horizontal directions. The deviation of the ball lens from the optimum spot must be less than 5 μm in the horizontal directions (X-, Y-directions). 5 μm is the maximum tolerance of the position of ball lens.

However, the rear surface emission type device has an emanating region on a surface and a converging lens on the other surface of a chip. A series of wafer processes produces emanating regions on the front surface. The other series of wafer processes fabricates cavities or sets of protrusions on the rear surface. The fabrication requires double wafer processes, which invite a difficulty of positioning between both surfaces besides the complexity of the wafer processes. The problem of the positioning will be now explained.

Light emitting devices are fabricated on compound semiconductor wafers, because light emission demands a direct transition of electrons between a band gap. Silicon wafers cannot be a substrate for light emitting devices, because silicon forbids the direct transition of electrons. The compound semiconductor wafer has an initial thickness of 400 μm to 500 μm. A series of wafer processes, i.e. epitaxial growth of films, selective etching, or formation of electrodes produces a lot of units of devices on the compound semiconductor wafer. The unit of a device corresponds to a part which will be an individual chip. Epitaxial layers and electrodes are produced on a surface. The surface having the epitaxial layers and electrodes is named a front surface. The substrate bottom is named a rear surface.

After the first wafer processes have fabricated units of light emitting devices on the front surface, the rear surface is ground in order to eliminate a part of the substrate. The back grinding (grinning of the rear surface) has three purposes. One purpose is enhancing the thermal diffusivity by thinning the wafer. In general, a big current flows at a narrow active region in a light emitting device. The large current density yields a great amount of heat at the active region. The wafer must be thinned in order to facilitate the diffusion of heat.

Another purpose of the back grinding is reducing the absorption of light. The rear surface emission type will incur much absorption loss of light, if the substrate is thick and the distance between the emanating region and the rear surface is long. Thus the rear surface must be ground in order to reduce the absorption loss of light.

What is the most important is adjusting the distance from the ground surface (main surface) to the emanating region at a determined value. Dispersion of the distance will fluctuate the convergence point, when a ball lens is glued to the main surface. Namely, the third object of the back grinding is adjusting the distance between the ball lens and the emanating region at a constant value.

The front surface bearing devices of the wafer is pasted on a polishing plate. The polishing plate is put on a polishing turn table. The rear surface of the wafer touches the turn table. The turn table revolves around a main shaft. The polishing plate rotates around its axis. The rear surface is ground till a predetermined thickness between 100 μm and 200 μm. The newly-revealed rear surface is designated as a main surface. Then the thinned wafer is removed from the polishing plate. Another series of wafer processes form cavities or sets of protrusions on the rear surface. In the processes, the centers of the emanating regions on the front surface must coincide with the centers of the cavities or the sets of protrusions on the rear surface. However, it is difficult to harmonize the positions of parts formed on the different surfaces. A series of wafer processes ensures a high accuracy only for treating one surface. But the wafer processes on both surfaces impair the preciseness of positioning of components because of the misalignment, deformation or bending of wafer.

The semiconductor wafer for fabricating light emitting devices is a large circular plate having a diameter of about 2 inches to 3 inches. The individual chip of the light emitting device is a small square of sides of 300 μm to 500 μm. The devices are fabricated by the steps of forming a lot of emanating regions and electrodes lengthwise and crosswise on the front surface of a wafer, grinding the rear surface till a certain thickness, and forming cavities or protrusions on the rear surface by etching, evaporation and photolithography.

The allowable error between the center of the emanating region and the center of the cavity or the set of protrusions must be less than ±5 μm. However, some bending accompanies a processed wafer, because the wafer is wide but very thin. The error of positioning parts on both surfaces is further increased by the size error of the masks for producing the emanating regions or protrusions by lithography. The centers of the emanating regions cannot easily coincide with the centers of cavities or protrusions with a small error less than the tolerance of ±5 μm.

Then cavities or sets of protrusions are formed on the rear surface. The wafer is divided into a plenty of chips. A ball lens is fixed with an adhesive at the center of the cavity or the set of protrusions on the rear surface of the individual chip. The adhesive is a type of hardening by heating in a furnace. The process of mounting a lens is followed by the inspecting process. The inspection comprises the steps of applying a current to the device for emitting light beams, monitoring the light power, and eliminating defective devices with light power smaller than a determined value. The inspection is required partly because the cavities or the protrusions on the rear surface do not always coincide with the emanating regions on the front surface, and partly because the lenses sometimes deviate from the regular spot by external vibration or shock before hardening the adhesive in a furnace. After the lens-mounting process has finished, the inspection begins in order to remove malfunctioning devices. The difficulty of alignment on both surfaces results in high rate of occurrence of defective devices and in low yield of passing products. Furthermore, since the cavity or the protrusions solely determine the position of the lens by geometric anisotropy, there is no means for revising the position of the lens at the mounting process. The difficulty of alignment and the lack of the position-revising means are likely to induce an occurrence of malfunctioned devices in the whole wafer.

A purpose of this invention is to provide a lens mounting method and apparatus which enable a precise positioning of lens on a chip which carries a lens directly on the main surface in order to harmonize the center of the emanating region with the center of the lens in the vertical direction. Another object of the invention is to provide a lens mounting method and apparatus which succeed in eliminating the double wafer processes on both surfaces which are apt to incur misalignment or discrepancy between both surfaces. Another object of the invention is to provide a lens mounting method and apparatus which prevent defective devices from occurring in the whole of a wafer by quitting the double wafer processes. Another purpose of the invention is to provide a lens mounting method and apparatus which fix a lens in tight contact with a chip, and prohibit the lens from deviating in the direction of a normal.

SUMMARY OF THE INVENTION

The lens mounting method of this invention comprises the steps of grinding a rear surface of a wafer having a front surface provided with a lot of light emitting devices including an emanating region and electrodes lengthwise and crosswise, decreasing the thickness till a predetermined value, dividing the wafer into individual chips including an emanating region, fixing the chip with the front surface down on a stage, supplying a driving current to an emanating region of the chip in order to emit light from the rear surface, observing the emanating region by a TV camera, determining a center of the emanating region by an intensity projection method and a gravity measurement method, supplying ultraviolet hardening resin on the center, conveying a lens which is held by a vacuum collet to the center of the emanating region, positioning the lens of the center in contact with the rear surface, irradiating the ultraviolet hardening resin with ultraviolet rays, hardening the ultraviolet hardening resin, fixing the lens on the chip, and detaching the vacuum collet from the lens.

Conventional methods depend upon the geometric anisotropy of cavities or protrusions for positioning a lens without seeking the center of the actual emanating region. On the contrary, this invention does not adopt cavities, protrusions or other geometric anisotropy for positioning of a lens. This invention features the disuse of cavities, protrusions or other prefabricated geometric anisotropy. The center of emanating region is sought by optical methods. A lens is positioned at the sought center and is fixed there. Since the device is actually examined by supplying a current and measuring the light power, no error shall occur in positioning the lens.

Conventional methods lay a ball lens on an adhesive, carry the chip in a furnace, heat the chip, and harden the adhesive. External shock or vibration will induce the deviation of a light lens, before the heat has hardened the adhesive. Instead of heat hardening adhesive, this invention employs ultraviolet hardening resin. The ball lens is fixed by ultraviolet hardening resin. The resin is hardened at a moment by the irradiation of ultraviolet rays. It takes a short time to harden the resin. The collet temporarily keeps the lens at the determined spot till the resin fixes the ball lens.

The processes of this invention are explained in more detail. The wafer with a rear surface ground is divided into individual chips. The chip is laid upside down on a stage which can move in two-dimensional, horizontal space and has a positioning function with high preciseness. A dispenser which ejects an adhesive can move in the vertical direction (Z-direction) but does not move in the horizontal directions (X-,Y-directions). A vacuum collet which suspends a lens can also displace only in the vertical direction (Z-direction). The vacuum collet does not move in the horizontal directions.

The power supply gives the device a driving current. The shining device is observed by a TV camera. The center of the emanating region is sought by an intensity projection method and a gravity measurement method. Then the stage having a chip is moved in X- and Y- directions till the center of the emanating region coincides with the center of the TV camera. The stage is moved by a determined distance in a determined direction which is defined as the difference between the TV camera and the dispenser. The center of the emanating region of the chip lies exactly beneath the tip of the dispenser. X-, Y-coordinates of the center are equal to X-, Y-coordinates of the dispenser. Then the dispenser falls in contact with the main (rear) surface of the chip and ejects a definite amount of adhesive (ultraviolet hardening resin) on the main surface. The dispenser rises and separates from the chip. The stage moves in XY-plane and attains a spot just below the vacuum collet holding a ball lens. The collet descends until the lens makes its way down in the resin and comes into contact with the main surface. Ultraviolet rays irradiate the adhesive resin. The resin hardens in a moment.

X-, Y-coordinates are predetermined for the TV camera, the resin dispenser and the vacuum collet. The three components cannot move in X-direction or in Y- direction. They can displace only in Z-direction. $(X1, Y1)$, $(X2, Y2)$ and $(X3, Y3)$ denote two-dimensional coordinates of the camera, the dispenser and the collet. Two-dimensional difference between the camera and the dispenser is designated by a vector $C(Xc, Yc)$, where $Xc=X2-X1$, $Yc=Y2-Y1$. The horizontal difference between the dispenser and the collet is given by another vector $D(Xd, Yd)$, where $Xd=X3-X2$, $Yd=Y3-Y2$.

After the center of the emanating region has been adjusted to the center of the camera, the stage carrying the chip displaces by the vector C. Then the emanating region lies exactly underneath the dispenser. The dispenser paints an adhesive of the main surface. The stage further moves by the vector D. The emanating region exists Just beneath the collet. In short, this invention mounts a lens on a chip by the steps of finding the center of the emanating region by the camera, displacing the chip by the feed C to a spot below the dispenser, and displacing the chip by the other feed D to a point underneath the collet. Since the feeds of C and D are equal to two-dimensional differences between two objects of the camera, the dispenser and the collet, the exact positioning by the camera enables the chip to displace just below the dispenser or the collet. The positioning is exact enough for the dispenser and the collet, because the camera, dispenser and collet have no freedom of motion in XY-directions. The stage can solely move in XY-plane.

The dispenser can rise and fall in Z-direction. The dispenser directly contacts the chip. The tip of the dispenser comes into contact with the rear surface. A sensor monitors whether the tip is in contact with the chip. If the contact is verified, the dispenser ejects a certain amount of adhesive on the chip. The contact of the dispenser ensures the precise supply of resin, because the contact excludes the function of surface tension. The contact supply of resin is one of the features of this invention. A shock absorber is furnished in order to alleviate the shock of the collision and to avoid the break of a chip.

The vacuum collet carrying a lens is also lowered till the lens comes into contact with the chip. A sensor is upholstered to monitor whether the lens is contacting to the chip or not. A shock absorber is provided for alleviating the shock of the collision. The collet presses the lens down against the chip. Irrespective of the size of lens, all lenses become into contact to the surface, because the fall of the lens is independent of the gravity. The lens never floats on the adhesive. The contact exactly adjusts the distance between the center of the lens and the emanating region in Z-direction without ambiguity. While the lens is forced on the chip by the collet, the adhesive resin is hardened by irradiating it with ultraviolet rays.

It is preferable that the dispenser and the collet should move at two steps of speeds, i.e. a higher speed and a lower speed in order to attain a destination quickly and exactly.

The converging lens is a ball lens or a spherical convex lens. The vacuum collet has a tip for vacuuming a lens. The inner contact wall of the tip is a cone or a trigonal pyramid. A conical wall is easy to shape. A trigonal wall precisely maintains a lens at a spot, because the spot is uniquely defined as a point distanced from the three walls by the radius of the lens.

The functions of this invention are explained. The lens-mounting method of this invention attaches a device chip on an XY-stage movable in both X-direction and Y-direction, supplies a current to the light emitting diode chip for emitting light, finds out the center of the emanating region by a television camera, and harmonizes the center of the emanating region with the center of the camera. Preferably the recognition of the emanating region should be carried out by two steps. First, an outline of the emanating region shall roughly be discovered in the whole vision of the camera by an intensity projection method. Second, the exact center of the emanating region shall be determined by a gravity measurement method in the confined region enclosing the emanating region.

Two-step observation can shorten the time of determinating the center of the emanating region. The two-step treatment can recognize the center of the emanating region with a reproducible preciseness less then $\pm0.1$ μm in a comparatively wide vision. Of course, the center of the emanating region can be determined with the same accuracy by a single step only of the gravity measurement method. But the single step will take a longer time than the two-step observation.

What conspicuously distinguishes this invention from the prior method is determining the emanating center by supplying a current to the device, monitoring the light by the camera and calculating the emanating center. Even if the positions of emanating regions fluctuate in individual chips, this invention can mount lenses just above the centers of the emanating regions. This invention is superior in the preciseness of the lens mount to the prior method.

The formation of the cavities or protrusions needs an additional process in prior art. This invention dispenses with such an additional process. Besides, the cavities or protrusions forbid a free positioning of a lens on a two-dimensional plane. The geometric anisotropy kills the freedom of positioning in the plane.

This invention does not form cavities nor protrusions, but adopts a flat rear surface for attaching a lens at an arbitrary spot. Geometric isotropy, i.e. the flatness of the rear surface gives the two-dimensional freedom of positioning to the chip. If the surface had a cavity, the lens could not be placed at the optimum spot which had been determined by the TV camera observation. The formation of geometric anisotropy contradicts the free positioning by the observation and pattern analysis. The flat surface allows this invention to fix a lens at an arbitrary spot. The lack of cavities or protrusions has a positive significance in this invention. When the emanating center is calculated, the XY-stage is moved to harmonize the center of the emanating region of the chip with the center of the vision of the camera.

Now the emanating center of the chip coincides with the center of the vision. Then the stage is shifted by a certain distance to a certain direction which is denoted by vector C. The chip lies just below the dispenser, because the feed of vector C is equal to the two-dimensional difference between the camera and the dispenser. The dispenser has a freedom in Z-direction but no freedom in X-direction and Y-direction. Since the camera does not move in XY-plane, the chip can be fed exactly underneath the dispenser by shifting the stage by vector C.

Otherwise the lens-mount might be accomplished by the simplified steps of harmonizing the emanating center with the camera center, replenishing an adhesive from a slanting dispenser to the chip, and supplying a lens from a slanting collet to the adhesive. However, such a slanting way would induce an anomalous distribution of resin and a deviation of lens. This invention allows the dispenser to replenish resin vertically and the collet to place a lens by a vertical motion.

Conventional methods have employed a heat-hardening adhesive which is hardened by heating in a furnace. The hardening requires a long time. Accidental vibration accompanies the conveyance to the furnace. The cavities or protrusions could stabilize the lens against the external vibration.

Such a heat-hardening adhesive is inappropriate to this invention, because the vibration or inclination of chips would induce a random shift of lens which is simply laid on a flat surface without a cavity or protrusions.

This invention requires an in site hardening adhesive which hardens in a moment. Then this invention adopts an ultraviolet hardening resin for fixing the lens.

The dispenser which supplies a constant quantity of adhesive to chips is equipped with a needle which ejects a certain quantity of adhesive. In the dispenser, the adhesive is compressed by air of a certain pressure for a certain time. The adhesive goes out from the needle. The fluid adhesive becomes a resin ball owing to the surface tension. The needle falls till the tip comes into contact with the chip. The resin is transferred to the chip in the contacting condition. The contact supply excels in quantitatively. The chip always receives a determined quantity of resin. Prior method drops an adhesive to a chip from an outlet separated from the chip. The separating supply cannot suppress the variations of the resin quantity due to the fluctuation of the height of a chip or the fluctuation of the surface tension. On the contrary, the contact supply allows this invention to suppress the fluctuation of the quantity of resin in spite of the fluctuation of the heights of chips.

Since the needle contacts chips, a protective device must be contrived not to break chips. GaAs is mechanically weaker than Si. InP is still more fragile for a shock than GaAs. In general, compound semiconductor is weaker than Si. Further the chip is very thin. A little impulse easily breaks an InP chip. Thus the dispenser should preferably be equipped with a mechanism for alleviating the gravity of the dispenser. A dose of the adhesive should be enough to flow on the sides and cover the pn-junction of the chip. The resin will protect the revealed pn-junction. Thus the adhesive resin plays a role of a passivation film of guarding the junction in addition to gluing the lens to the chip. The transfer of the resin from the dispenser to the chip is called "transcription".

When the resin has been transcribed, the dispenser is lifted up. Then the XY-stage is shifted by vector D. The feed of vector D is equal to the two-dimensional difference between the dispenser and the collet. Thus, the chip lies just underneath the vacuum collet which has vacuumed a lens at the tip. The precision of positioning of a lens on a chip is affected by the fluctuation of the position in the collet. Preferably the inner wall of the tip of the collet should be shaped in accordance with the shape of the lens in order to expel the ambiguity of positioning. For example, the tip of a collet should be provided with a conical inner surface or trigonal pyramid inner surface for a ball lens. The conical surface is easy to shape because of the rotational symmetry. The trigonal pyramid surface is rather difficult to cut. But the trigonal pyramid ensures the exact hold of a lens owing to the three point contact.

The vacuum collet also displaces only in Z-direction. When the chip has been conveyed beneath the collet, the collet with a lens starts to fall. At first the collet descends faster, but sinks slower afterward. For example, the first speed of fall is 5 mm/s and the second speed is 0.5 mm/s. The high speed fall of the first step shortens the falling time. The slow fall of the later step lessens the impulse of collision.

This invention forces a lens to come into contact with the main surface of a chip. The collet presses the lens down to the surface instead of the gravity upon which prior methods have relied. The contact of the lens to the chip uniquely determines the height of the lens, which enhances the precision in Z-direction and curtails the time of mounting. The compulsory contact of lens would injure the chip on the other hand. To avoid the impairment, the collet should preferably be equipped with the two step falling mechanism and a shock absorber.

The advantages of this invention will be explained. This invention mounts a lens on a chip of a light emitting diode which emits light from the opposite (rear) surface to the emanating region by the steps of supplying a current for emitting light, observing the emanating region by a TV camera, calculating the center of the emanating region, harmonizing the emanating center with the center of the camera, painting the center of the emanating region with ultraviolet hardening resin, putting a lens on the resin, pushing down the lens to the chip, and hardening the resin by irradiating the resin by ultraviolet rays. Since the center of the emanating region is sought for individual chips by an actual observation, and a lens is fixed on the real center, this invention succeeds in suppressing the error of positioning of lens within the tolerance of ±5 μm.

No cavities nor protrusions are formed on the wafer for the positioning of lens. The main surfaces of chips are even. The flat surface can eliminate the process of making the cavities or protrusions, which simplifies the wafer processes. Besides, the exclusion of the geometric anomaly guarantees the precise positioning of lens, because the misalignment of lens has rather been caused by the cavities or protrusions. The main surface is an even plane. The even surface allows controlling the thickness of the wafer exactly which has been polished. The flatness ensures an accurate determination of the distance between the lens and the emanating region.

The contact transcription of the adhesive bestows the dispenser with excellent quantitativity. The adhesive is hardened in a moment, while the collet holds the lens being in contact with the chip, which exactly determines the distance between the lens and the emanating region. This invention succeeds in the simplification of wafer processes, the prevention of occurrence of defective objects in the whole of a wafer, an enhancement of coupling efficiency to a fiber, and a great reduction of cost of production.

BRIEF DESCRIPTION OF THE DRAWINGS

FIG. 5(a) exhibits the state in which the needle ejects glue to the chip separating from the needle. FIG. 5(b) shows the state in which the needle is lifted up.

FIG. 6(a) is a state in which a resin ball is formed. FIG. 6(b) is a state in which the needle is in contact with the chip. FIG. 6(c) is the state in which the needle is lifted away.

FIG. 8(a) is a vertically-sectioned view. FIG. 8(b) is a bottom view.

DETAILED DESCRIPTION OF THE PREFERRED EMBODIMENTS

Figure 1:
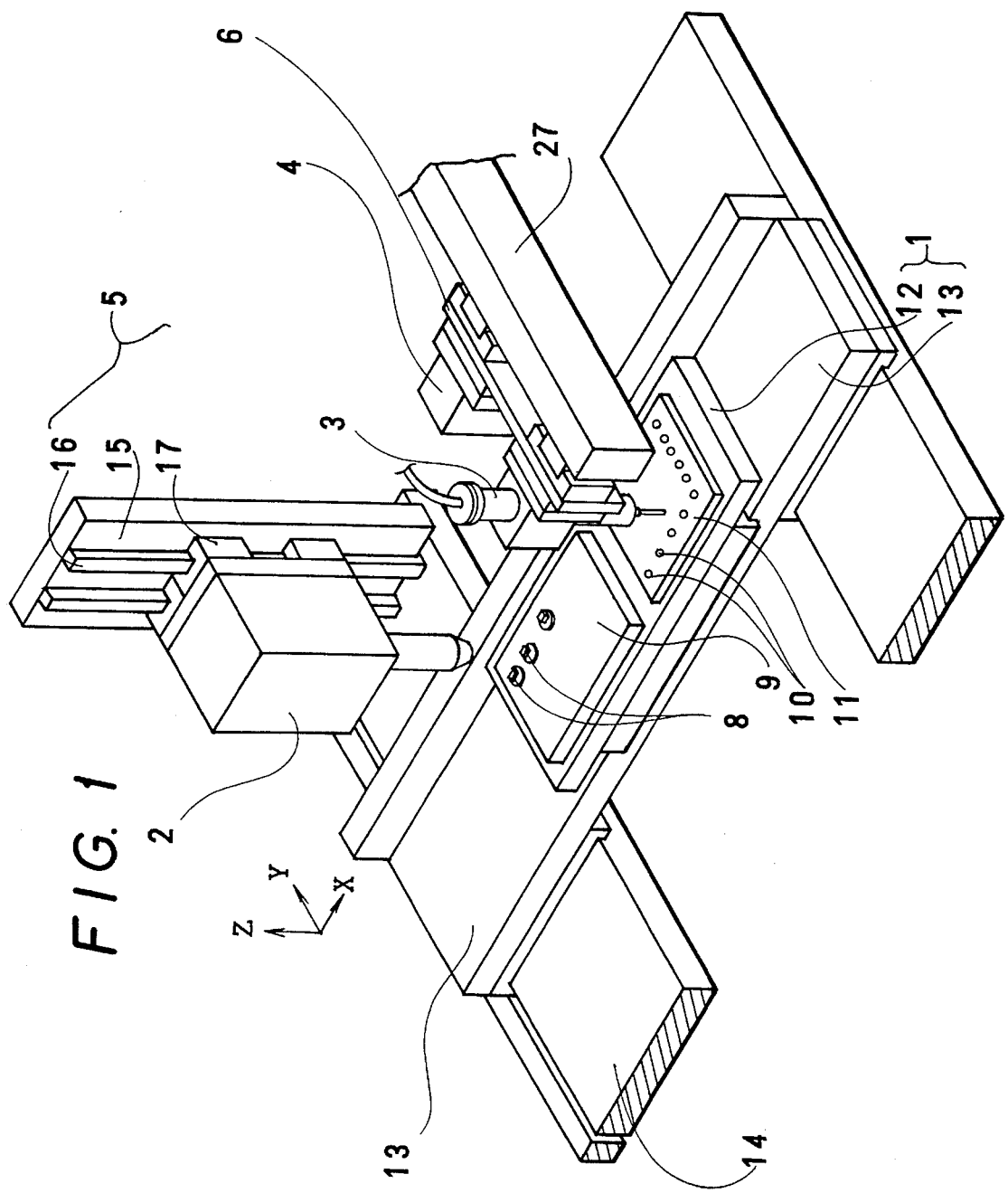
FIG. 1 is a perspective view of a lens-mounting apparatus as an embodiment of this invention.

FIG. 1 shows an embodiment of a lens-mounting apparatus of this invention. The apparatus comprises an XY-stage (1), a TV camera (2), a dispenser (3), a vacuum collet (4), a camera Z-stage (5), and a collet Z-stage (6). The XY-stage (1) conveys light emitting diode chips and lenses in the horizontal plane (XY-plane). Light emitting diode chips (8) are laid on a device tray (9). Ball lenses (10) are arranged on a lens tray (11). Both the device tray (9) and the lens tray (11) are put on an X-stage (12). The X-stage (12) rides on a Y-stage (13) which extends in Y-direction. The X-stage (12) can move in Y-direction on the Y-stage (13). The Y-stage (13) slidably lies on fixed tables (14) which are long in Y-direction. The Y-stage (13) can freely move in Y-direction on the table (14). The XY-stage (1) consists of the X-stage (12) and the Y-stage (13).

In practice, the stages can be displaced at any positions with high precision by motors, reduction gears or screw feeder and bearings which allow the stages to move with little friction. The embodiment employs an air-floating suspension for holding the stages. Since the stages (12) and (13) are floating by air on the Y-stage (13) and tables (14), the stages (12) and (13) can displace without friction and can pause at any points with preciseness. Resolution is 0.1 μm both for the stages (12) and (13).

A plurality of light emitting diodes (8) are arranged with the main (rear) surfaces upside lengthwise and crosswise on the device tray (9). The light emitting diode chips have been die-bonded on packages. Electrode pads of the chips are connected to leads of the packages. If a current is applied to the leads, the chips emit light beams from the main surfaces.

A plurality of small holes have been dug lengthwise and crosswise on the lens tray (11). Small ball lenses are stored in the holes. Among the movable objects, solely the XY-stage (1) moves in the horizontal directions. Namely, the light emitting devices (8) and the lenses (10) can displace in X-direction and Y-direction. The camera (2), dispenser (3) and vacuum collet (4) can displace only in Z-direction.

The infrared camera (2) can move in the vertical direction by the camera Z-stage (5). The Z-stage (5) comprises a pillar (15), vertical rails (16), sliding blocks (17) which slide up and down on the rails (16), a ball screw shaft (not shown in the figure) rotatably installed along the rails (16), a ball nut fixed to the camera and engaging with the feeding screw shaft, and a motor rotating the screw shaft. When the motor rotates the screw shaft, the ball nut is moved up or down. Then the camera ascends or descends with the ball nut. Since such a precise feeder has been well known, the details are not shown in the figures. The camera is equipped with a microscope in order to make an enlarged image of an object laid down below on a screen. The focal point will be adjusted on the surface of the object by the Z-stage (5) carrying the camera (2).

First, the XY-stage (1) conveys a light emitting diode chip (8) to a spot just underneath the camera (2). The camera finds out the center of the emanating region of the chip by optical means and an image processing. The image processing has two steps:

Step 1: an intensity projection method seeks an outline of the emanating region in the whole vision of camera.
Step 2: a gravity measurement method determines the exact center of the emanating region in a confined region.

Figure 2:
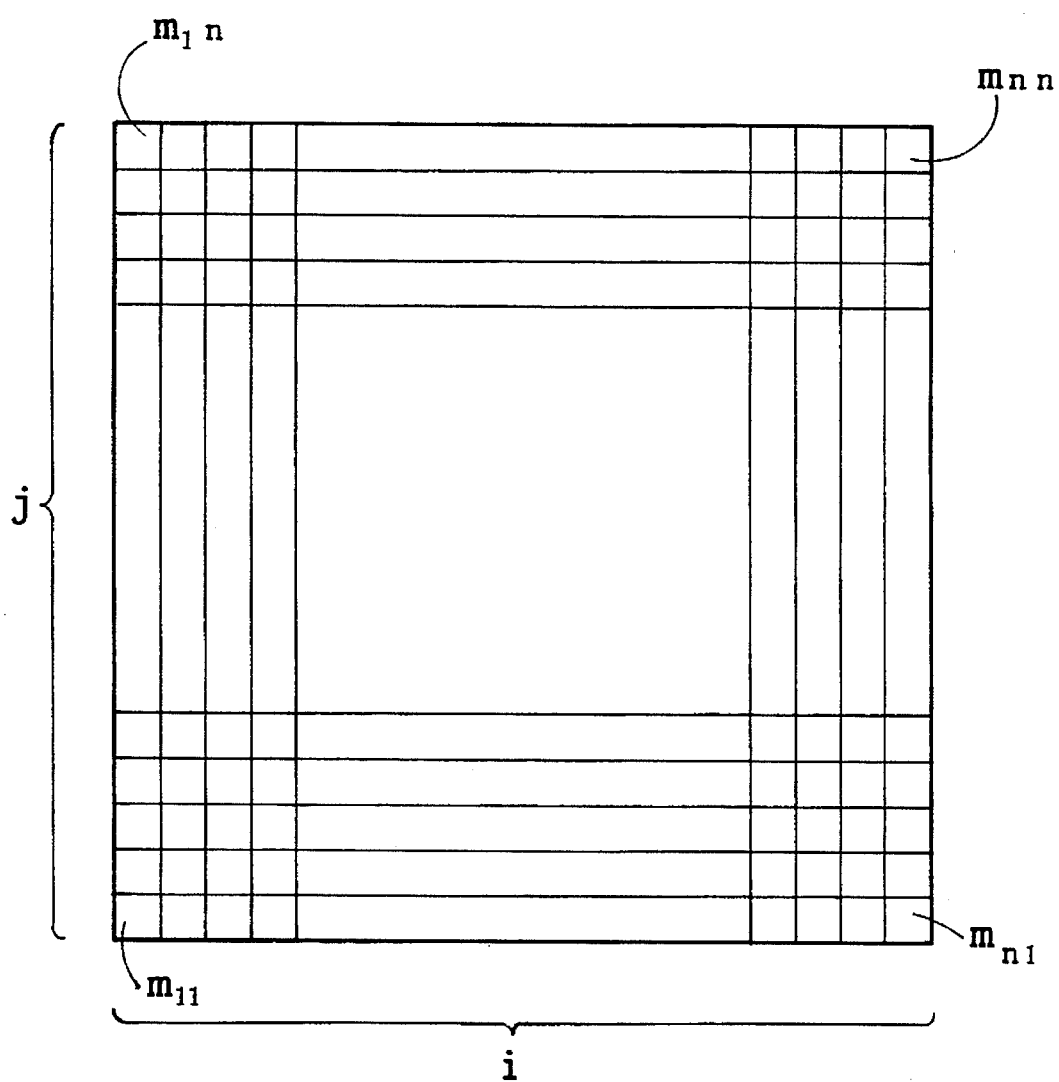
FIG. 2 is a plan view of the fields of vision of a camera for explaining the principle of an intensity projection method for roughly determining the center of the emanating region.
Figure 3:
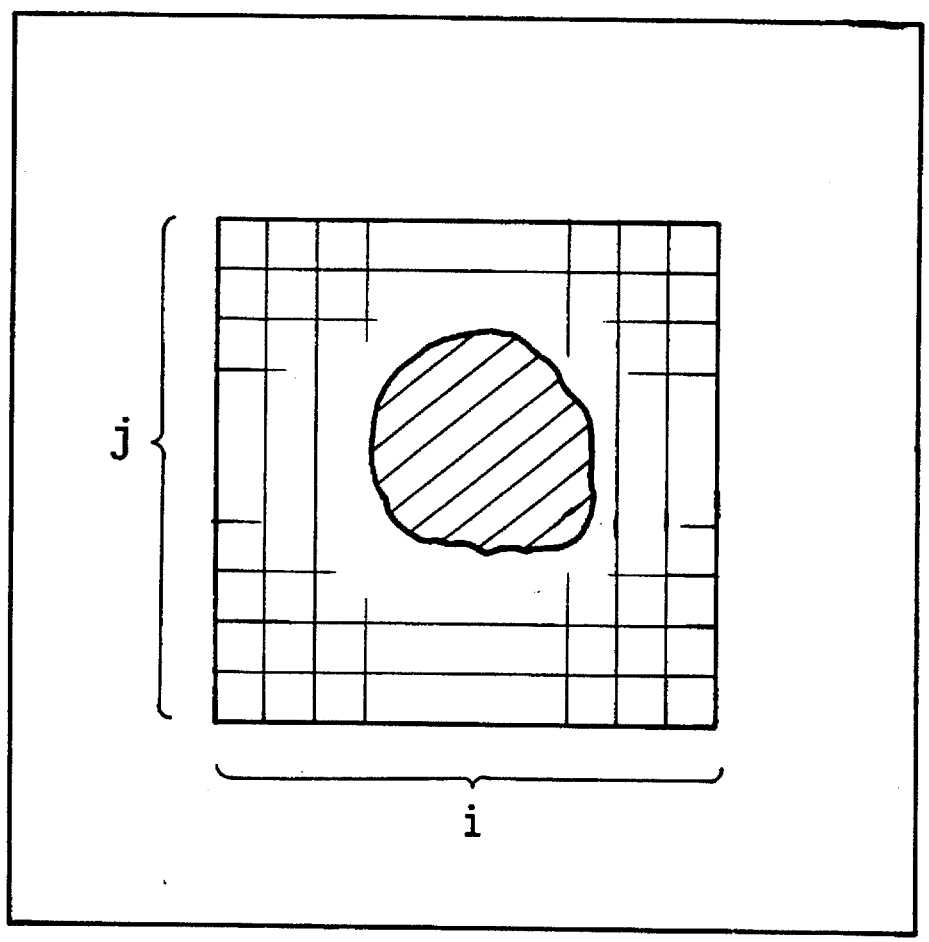
FIG. 3 is a plan view of the confined region in the fields of the camera for demonstrating a gravity measurement method for determining the center of the emanating region rigorously.

The intensity projection method is explained by FIG. 2. The whole vision of the camera is divided lengthwise and crosswise like a lattice. The divided unit is called a pixel which is a minimum component having a variable signifying the degree of intensity of light entering the unit. The set of pixels constructs a matrix. Two-dimensional coordinates are attached to the pixels. The leftest bottom is the origin. This pixel is numbered $M_{11}$. J is the number of lines. I is the number of columns. Thus i is x-coordinate and j is y-coordinate in the unit of pixel. (i,j) denotes an individual pixel defined in the two-dimensional coordinate. $M_{ij}$ is a pixel lying at a spot of the i-th in X-direction and the j-th in Y-direct ion.

For example, the size of a pixel is 1 μm×1 μm in the object space (real space). The camera has, for example, 500×500 pixels in the whole vision. In this case, the whole vision of the camera corresponds to a square of 500 μm×500 μm (0.5 mm square) in the object plane. First, a device chip to be treated is carried within the vision of the camera by the XY-stage. A driving current is replenished to the device from a power source through the leads and wires equipped in the device tray. The device emits light beams upward. The camera must have a sensitivity for the rays emitted from the device. The camera shall be changed according to the wavelength of the light of the devices. If the objects are InP light emitting diodes which cast infrared light, the camera shall be an infrared camera which has high sensitivity for infrared light. Otherwise, if the objects are devices emitting visible light, the detector shall be an ordinary camera.

The camera observes the rays emitted from the emanating region. The image of the region is divided into pixels. The intensity of light in an individual pixel is classified into some degrees, for example, into 256 steps (monochromatic degrees from white to black). "$m_{ij}$" denotes the light intensity of pixel $M_{ij}$. "n" is the number of pixels in a line or in a column. The intensity projection method calculates X-sums of the intensities of all pixels aligning in all columns, and Y-sums of the intensities of the pixels aligning in all lines. Here $X_i$ denotes the vertical sum of the intensities $m_{ij}$ of the pixels $M_{ij}$ belonging to the i-th column. $Y_j$ designates the horizontal sum of the intensities $m_{ij}$ of the pixels $M_{ij}$ aligning in the j-th line. Then the method finds out the column i and the line j which maximize the sums among all the vertical sums and the horizontal sums.

$$X_i = \Sigma_{j=1}^{n} m_{ij} \quad (1)$$

$$Y_j = \Sigma_{i=1}^{n} m_{ij} \quad (2)$$

$$X_{max} = \max\{X_i\} \quad (3)$$

$$Y_{max} = \max\{Y_j\} \quad (4)$$

Line k=j denotes the line giving the maximum $Y_{max}$ among the horizontal sums $\{Y_j\}$. Column h=i denotes the column realizing the maximum $X_{max}$ among the vertical sums $\{X_i\}$. Namely $Y_k = Y_{max}$, $X_h = X_{max}$. The result means that the center of the emanating region must lie in the vicinity of pixel $M_{hk}$. The emanating region should cast light beams in a regular distribution which will maximize the sums of the intensities of the column and of the line which cross the center of the region. This method projects the intensity on X-axis and Y-axis by summing up the intensities of the pixels along the vertical direction and horizontal direction. Thus it is called an intensity projection method. Since this way includes only addition, the calculation is quickly done. Besides the short calculation time, this method has another merit. When the vision includes reflection of external light or leak light from the device itself, the gravity measurement in the whole vision would misunderstand the center of the emanating region. Precedence of the intensity projection guarantees the avoidance of the mistake in the recognition of the emanating center.

However, this method is unable to discover the pixel by itself which actually maximizes the light power. The preciseness is contingent upon the size of a pixel. Rough recognition or outline detection is the purpose of the preceding intensity projection method. If the distribution of the intensity is steep enough, in the emanating region, it should be preferable to thin out columns and lines into half or one third in order to curtail the time of calculation.

The temporarily sought center $M_{hk}$ of the emanating region is displaced to the center of the camera. Then the gravity measurement method is applied to the image of the emanating region. Since the pattern of the emanating region is restricted in the vicinity of the center of the vision, the object of consideration is confined in a small square which is about one tenth to four tenths of the whole vision. If the whole vision is 500 μm×500 μm, the confined region should be a square of about 50 μm×50 μm to 200 μm×200 μm. Narrower square is also available for the confined region. The confined region includes the center of the emanating region. The number of pixels is far smaller than that of the whole vision, which curtails the time of processing. The light power $m_{ij}$ of pixel $M_{ij}$ has been stored in a memory, for example, in 256 steps. The center of gravity G(Xg, Yg) is calculated with a weight of intensity $m_{ij}$. Xi is the X-coordinate of the i-th column. Yj is the y-coordinate of the j-th line. The center of gravity is determined by weight-including averages of the coordinates.

$$Xg = \frac{\Sigma_{i,j} m_{ij} X_i}{\Sigma_{i,j} m_{ij}} \quad (5)$$

$$Yg = \frac{\Sigma_{i,j} m_{ij} Y_j}{\Sigma_{i,j} m_{ij}} \quad (6)$$

The summation Σ is carried out with i and j of all the pixels including in the confined region. The scope of average is not the whole vision but is the confined region having smaller number of pixels. Since smaller number of pixels are into consideration, the time of calculation is curtailed.

The center of gravity G(Xg, Yg) calculated now is identified as the center of the emanating region. The gravity measurement method takes a longer time for calculation, because it includes multiplication, division besides addition. The embodiment roughly estimates the center of the emanating region by the intensity projection method at first and rigorously calculates the center by the weight-including gravity measurement method secondly.

Since the gravity measurement method includes the process of average, the center is determined with higher precision than the unit of a pixel. Although the size of a pixel is 1 μm×1 μm, the coordinate of the center can be defined with the preciseness of 0.1 μm, which corresponds to the resolution of the stages. A little displacement of the XY-stage adjusts the center of gravity with the center of camera. Now the center of the emanating region coincides with the center of camera.

The relation between two-dimensional position (X1, Y1) of the camera and two-dimensional position (X2, Y2) of the dispenser is predetermined. Thus vector C (Xc, Yc) which has been determined as a difference between the camera and the dispenser is also predetermined. When the device has exactly been positioned to the camera, the XY-stage is moved by vector C. The emanating region of the chip comes to a spot just below the dispenser.

Figure 4:
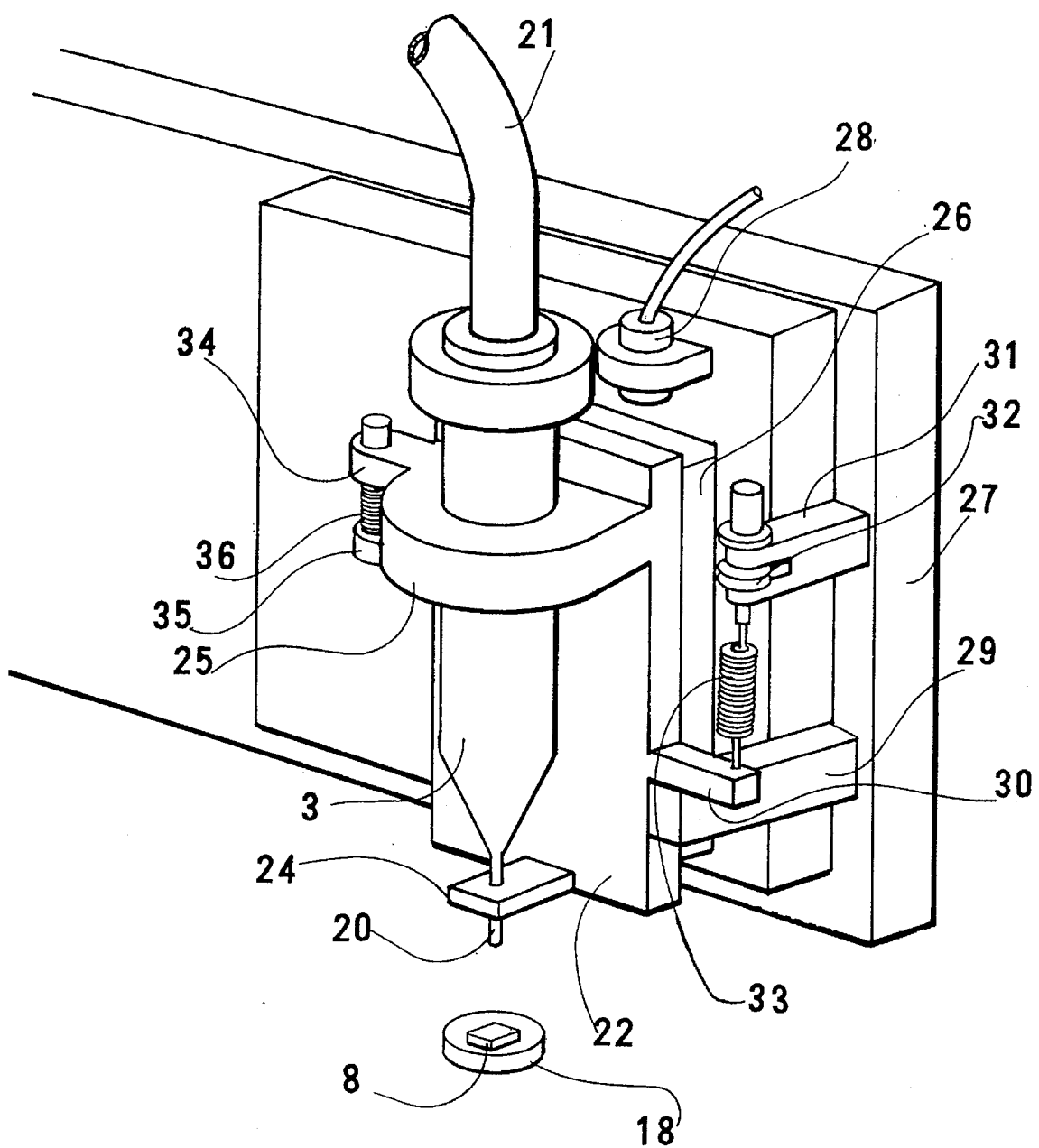
FIG. 4 is a perspective view of a dispenser for ejecting an adhesive on chips.

The Z-axis stage (6) holds the dispenser (3), allowing it to rise and fall. FIG. 4 shows the dispenser. The dispenser (3) is a cylindrical vessel filled with ultraviolet hardening resin. The resin is an adhesive which is hardened by the irradiation of ultraviolet rays instead of heat or air. The bottom end is formed into a narrow needle (20). The upper opening is joined to a pipe (21) through which compressed air is introduced to the upper space of the dispenser. A vertical slide plate (22) holds the dispenser (3) by an upper retainer (25) and a lower retainer (24). There is a linear guide (26) at the back of the slide plate (22). The linear guide (26) supports the vertical slide plate (22), allowing it to rise and fall. The slide plate (22) is coupled to the linear guide (26) by vertical rails and grooves (not shown in the figures). The linear guide (26) is fixed to a Z-axis stage (6). The Z-axis stage (6) is slidably supported by a rear holding arm (27). The linear guide (26) and the Z-axis stage (6) can ascend or descend with regard to the holding arm (27). A displacement sensor (28) monitors the height of the slide plate (22).

The holding arm (27) is at rest. The Z-axis stage (6) and the linear guide (26) move up and down in a body. The slide plate (22) accompanies the Z-axis stage (6) and the linear guide (26) almost all the time. However, when the needle (20) comes into contact with the light emitting diode (8), the linear guide slightly slides on the linear guide (26). At the moment the dispenser (3) stops but the linear guide (26) and Z-stage (6) still continue falling. The vertical rails and grooves allow the relative slide between the slide plate (22) and the linear guide (26).

A stopper (29) projects forward from the Z-axis stage (6). The slide plate (22) has an extension (30) on one side. Almost all the time the extension (30) rides on the stopper (29) of the Z-axis stage (6). The weight of the dispenser (3) and the slide plate (22) transmits through the extension (30) and the stopper (29) to the Z-axis stage (6). The coupling of the stopper (29) and the extension (30) makes the slide plate (22) accompany the linear guide (26) in almost all the motion. The stopper (29) supports the extension (30) of the slide plate (22) upward. The set of the stopper (29) and the extension (30) allows the dispenser (3) to rise from the linear guide a little but inhibits the dispenser (3) from falling from the linear guide. The unilateral coupling of the extension (30) and the stopper (29) alleviates the impulse acting upon the chip (8) by separating the weight of the linear guide (26) and the Z-axis stage (6) from the dispenser (3), when the needle (20) collides with the chip (8). Besides the unilateral coupling, the impulse on the chip is further reduced by another mechanism.

The Z-axis stage (6) has a bracket (31) on the side. An expanded spring (33) for counterbalance connects the bracket (31) of the Z-axis with the extension (30) of the slide plate (22) by elastic force. Since the spring has been fitted between the bracket (31) and the extension (30) in the expanded state, this spring (33) gives the tensile force to the slide plate (22) for lifting up the dispenser (3). The spring (33) reduces the impulse at the collision by pulling up the dispenser (3). There is an adjustment screw (32) at an end of the spring for adjusting the tensile strength of the spring (33).

Another spring (39) is furnished on the other side of the slide plate (22) to alleviate the shock of collision. The slide plate (22) has a protuberance (34). The linear guide (26) is provided with another protuberance (35). The spring (36) is sandwiched in the compressed state between the protuberances (34) and (35) for counterbalance. This compressed spring (36) has a force for lifting the slide plate (22). The compressed spring (36) has the same function as the extended spring (33). Both springs (33) and (36) play a role of killing the gravity of the dispenser (3) and slide plate (22) and decreasing the impulse on chips (8).

W designates the weight of the dispenser (3) and the slide plate (22). T denotes the tensile force of the extended spring (33) for counterbalance. S denotes the compressive force of the spring (36) for counterbalance. The resultant force F acting between the stopper (29) and the extension (30) is only F=W-T-S. This equation clearly demonstrates the function of the springs (33) and (36) as counterbalances.

At the beginning stage of falling of the Z-axis stage (6), the dispenser (3) and the slide plate (22) accompany the Z-axis stage (6) and the linear guide (26). When the needle (20) collides with the light emitting device chip (8), the dispenser (3) and the slide plate (22) stop falling. But the linear guide (26) and the Z-axis stage (6) continue falling. At the moment, the movement of the linear guide (26) and the Z-axis stage (6) is separated from the slide plate (22). Since the linear guide (26) and the slide plate (22) must fulfill different movements, the linear guide (26) forgives the slide plate (22) for a relative rise. If the relative movement were forbidden, the impulse would be so strong and the device chip (8) would be broken.

Since the device chip (8) is thin and fragile, the shock at collision must be alleviated. Two contrivances contribute to lessen the impulses. One is the two step failing of the Z-axis stage (6): a faster fall at the earlier stage and a slower fall at the latter stage. The slow contact decreases the impulse of collision. The other is the counterbalance due to the springs (33) and (36) which pull or push upward the slide plate (22). The springs reduce the force acting on the stopper (29) by the extension (30) from W to W-T-S. This is equivalent to the effective decrease of the mass of the dispenser and the slide plate to (W-T-S)/g, where g is the gravity acceleration. The strength of the springs should be adjusted in order to reduces the effective mass till about 2 g to 5 g. Then the collision of the dispenser invites an impulse not of an object with a mass W/g but of an object with a mass of (W-T-S)/g. In this case, what strikes the chip is a light object of a mass of 2 g to 5 g.

Another contrivance is the slow collision due to the two step falling of the dispenser. When the needle of the dispenser collides with the chip (8) at the speed v, the chip incurs an impulse P of P=(W-T-S)v/g. Falling speed v is small enough to protect the chip by reducing the impulse. The impulse equation P=(W-S-T)v/g clarifies the effects of the two contrivances for alleviating the shock. The two-step falling diminishes the speed v. The counterbalance springs abate the effective weight of the dispenser by (-T-S).

Figure 5A:
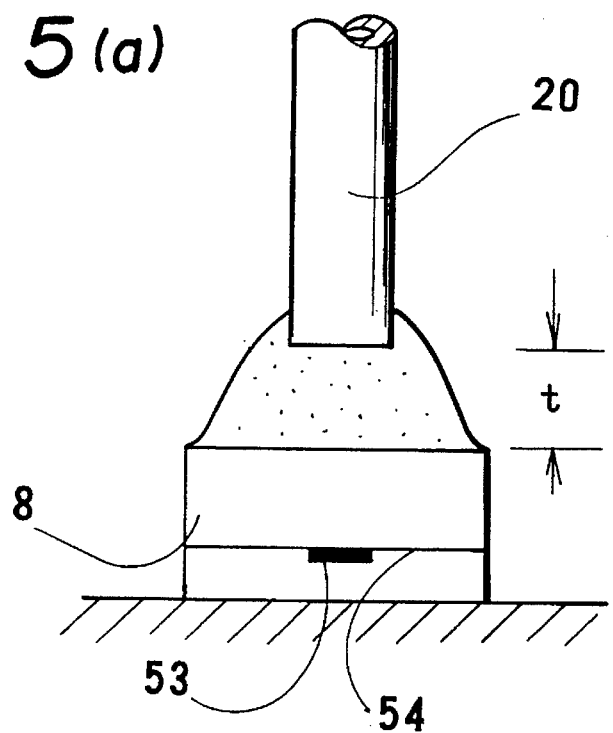
FIG. 5(a) and FIG. 5(b) are sectional views of a chip, glue and a needle for explaining a conventional manner of supplying glue (adhesive) to the chip.
Figure 5B:
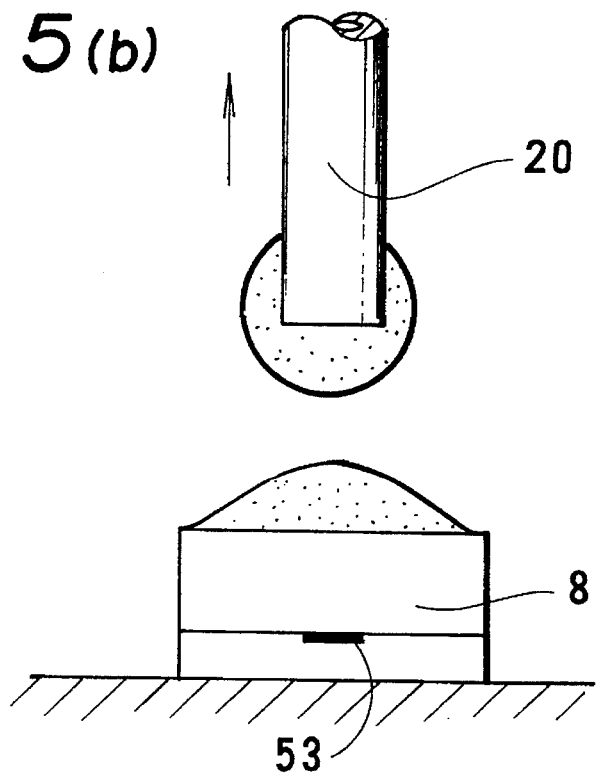

Then the reason why the needle must come into contact with the chip will be explained. First, the prior way is demonstrated by FIG. 5, where the cavities or protrusions are neglected here. The conventional method can be safely called non-contact supply. The prior methods supply a glue in a separated condition, being afraid of the break of a chip. The needle ejects a glue to the device chip (8) with a gap of t. The fluid glue extends on the surface, as shown in FIG. 5(a). The side of the glue has a random shape owing to the surface tension. Then the needle rises. Most of the resin accompanies the needle (20) by the surface tension, as shown in FIG. 5(b). Since the chip is deprived of most of the glue by the needle, the glue cannot cover the whole surface of the chip. The sides of the chip are uncovered. The vulnerable pn-junction is exposed in air on the sides. Another drawback would be induced by the shortage of painted resin, If the prior supply would be applied to this invention. As prior method hardens the resin by heat, the shortage of resin induces no difficulty. However, this invention adopts ultraviolet hardening resin which has a special property. Insufficient resin is fatal to ultraviolet hardening resin. If the amount of fluid resin is insufficient, the resin is not hardened by the irradiation of ultraviolet rays. The resin perhaps has a threshold regarding the amount. Satisfactory ultraviolet rays cannot harden a small amount of the resin less than the threshold at all. Hardening is contingent upon the amount of resin. The reason has not be clarified yet. Ultraviolet hardening resin is anaerobic. The resin deteriorates rapidly in air. Then a smaller drop of resin has a higher rate of surface/volume, which heightens the chance of contacting oxygen for resin molecules. Small drop of resin cannot prevent oxygen from invading in the drop to degenerate the property as an adhesive. Such a reason may require a certain amount of resin more than a threshold. The requirement is contingent on the property of ultraviolet hardening resin.

Figure 6A:
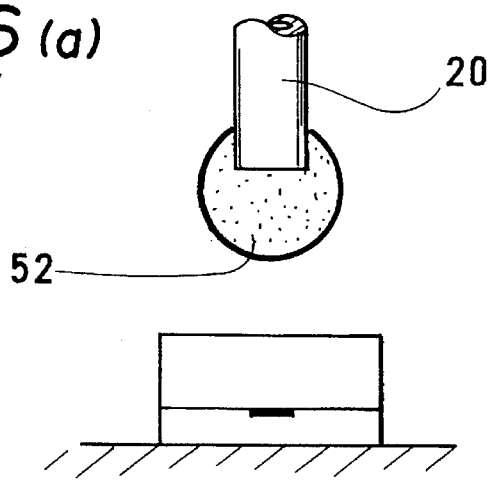
FIG. 6(a), FIG. 6(b) and FIG. 6(c) are sectional views of a chip, resin, and a needle for explaining the manner of this invention for supplying resin to the chip.
Figure 6B:
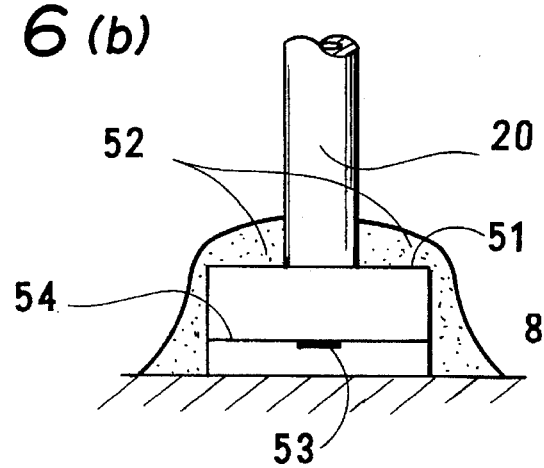

FIG. 6 explains how to paint ultraviolet hardening resin on a chip in this invention. Introduction of compressed air to the dispenser in a certain time extrudes a dose of ultraviolet hardening resin from the tip of the needle (20). Since the needle is still free, the dose forms a ball of resin by the action of surface tension. The ball is 500 μm to 700 μm in diameter (0.000012 cc to 0.000034 cc). The dispenser is sunk till the tip of the needle (20) comes into contact with the main surface of the light emitting diode (8). The resin ball is transcribed to the chip (8) in the contact state. The transcribed quantity is about $1.0 \times 10^{-5}$ cc to $2.0 \times 10^{-5}$ cc. Sufficient amount of ultraviolet hardening resin pervades the main surface. Part of the fluid drips on the sides. The fluid covers and protects the pn-junction on the sides, as shown in FIG. 6(b). The side-dripping resin has a role of a passivation film which protects the device from oxygen, water or chemicals.

Figure 6C:
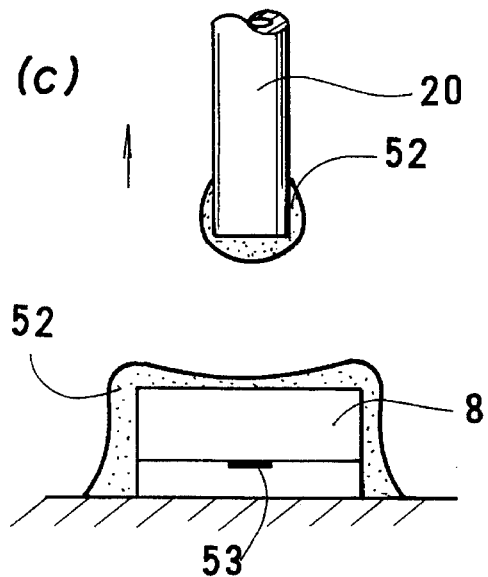

The transcription in the contact condition enables the resin to transfer to the chip perfectly. The contact transcription is superior in preciseness of dose and affluence of supply to the prior separating transcription of FIG. 5. Since shortage of resin induces ill-hardening due to oxygen, affluent supply of resin is indispensable to the ultraviolet hardening resin. This invention keeps the contact state for a certain time (about 1 sec), before the needle is lifted. The contact and the pause guarantee a nearly complete transfer of resin to the chip. Little resin remains on the needle (20) as shown in FIG. 6(c).

Figure 7:
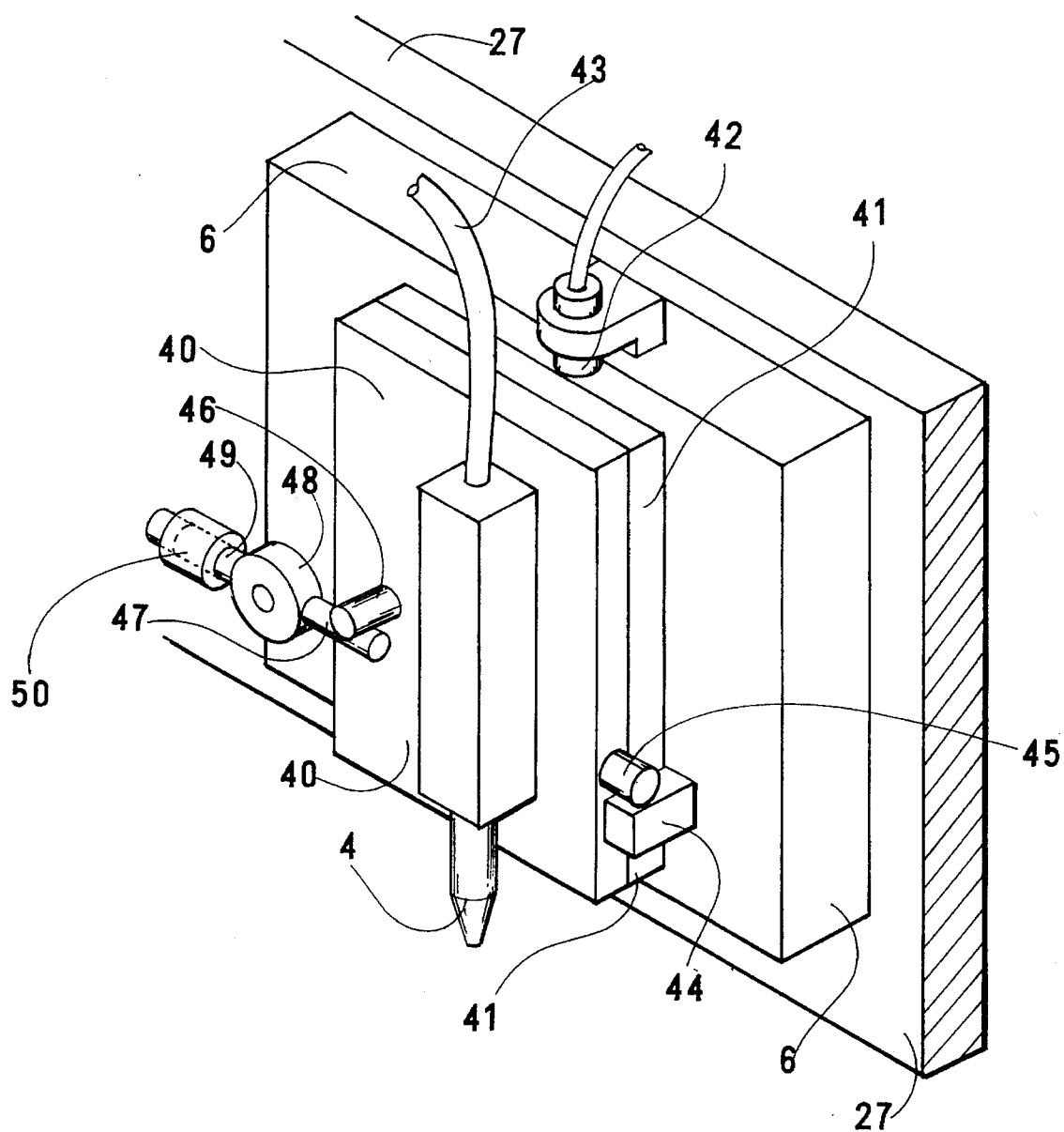
FIG. 7 is an oblique view of a holding apparatus of the vacuum collet.

Then the XY-stage (1) is displaced by vector D(Xd, Yd). Now the device chip (8) lies just underneath the vacuum collet (4). FIG. 7 shows the vacuum collet (4). The vacuum collet (4) is held by a vertically sliding plate (40). A linear guide (41) suspends the sliding plate (40), allowing an upward relative movement. The linear guide (41) is fixed to the Z-axis stage (6). The Z-axis stage of the collet may be common with the Z-axis stage of the dispenser(3), as shown in FIG. 1. Otherwise different Z-axis stages are also available for the dispenser and the collet, as shown in FIG. 4 and FIG. 7.

A displacement sensor (42) monitors the relative height of the sliding plate (40) to the Z-axis stage (6). A pipe (43) couples the vacuum collet (4) with a vacuum pump (not shown in the figures). The linear guide is provided with a stopper (44) projecting forward. The sliding plate (40) has a side protuberance (45). The protuberance (45) rides on the stopper (44). Through the unilateral coupling, the linear guide (41) supports the holding plate (40) upward.

The sliding plate (40) has a projection (46) on the front surface. A lever (49) is rotatably supported by a pin (48) on the Z-axis stage (6). A front end (47) of the lever (49) touches the lower side of the projection (46) of the sliding plate (40). The lever (49) is equipped with a balance weight (50) at the other end. The balance weight (50) generates a moment for holding up the sliding plate (40) and the collet (4). The moment produced by the balance weight (50) can be adjusted by the position of the weight. The vacuum collet (4) pulls up a lens at the bottom tip.

G denotes the weight of the vacuum collet (4) and the lens. R is the force of balance weight (50) for lifting the sliding plate (40). Then the force ti acting on the stopper (44) and the projection (46) is H=G-R. H should be adjusted to several grams. H means the force pressing the lens toward the chip. The balance weight (50) fills the role equivalent to the springs (33) and (36) in FIG. 4. The balance weight (50) reduces the effective force acting on the chip.

Like the dispenser, it is preferable for the vacuum collet to fall faster at the early stage and slower at the latter stage. The impulse upon the chip is (G-R)v/g at the collision, where v is the falling speed of the collet. Springs and balance weights are adopted for cancelling the weight of the dispenser or the collet. Springs and weights have a similar function for shock absorber. But springs and balance weights slightly differ from each other in decreasing the shock. Springs have no inertia. Springs can kill the weight from the moment of collision. But balance weights have inertia. At the moment of collision, balance weights cannot cancel the force of the dispenser or collet owing to inertia. The balancers kill the weight, after they have attained to a stationary state. The delay time is a square root of the quotient of rotation moment divided by gravity accelerator g. However, in practice, the collet sinks slowly. The slow fall of the collet enables the balancer to absorb the impulse effectively. This example adopts balance weights for the vacuum collet and springs for the dispenser. Otherwise, the reverse selection is also available. Springs can be adopted both for the collet and the dispenser as a shock absorber. Balance weights can also be employed both for the dispenser and the collet.

Holding a lens, the vacuum collet is prepared to supply the lens to the chip. For the purpose, the vacuum collet has been moved above a lens by displacing the XY-stage (1), has been sunk to the lens and has pulled up the lens. The vacuum collet is waiting in the state.

Figure 8A:
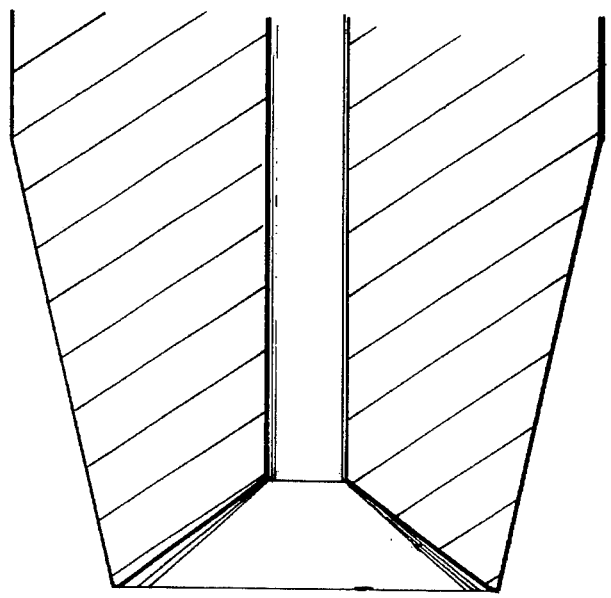
FIG. 8(a) and FIG. 8(b) are views of a conical collet.
Figure 8B:
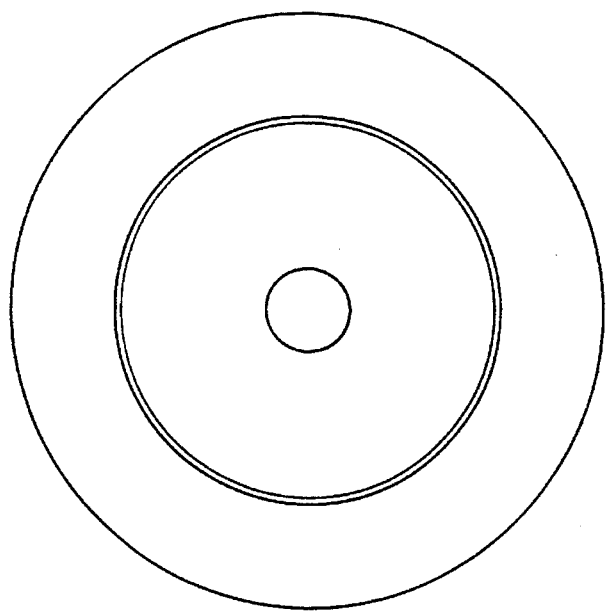
Figure 9A:
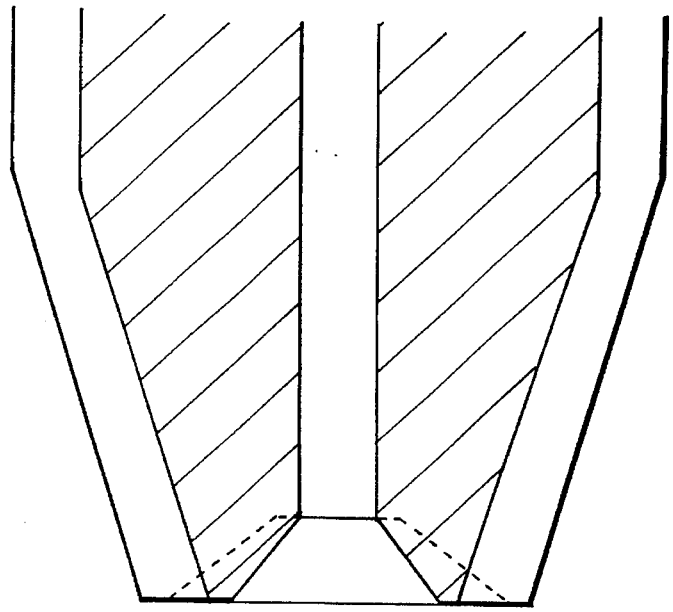
FIG. 9(a) and FIG. 9(b) are views of a sectional view of a conical collet.
Figure 9B:
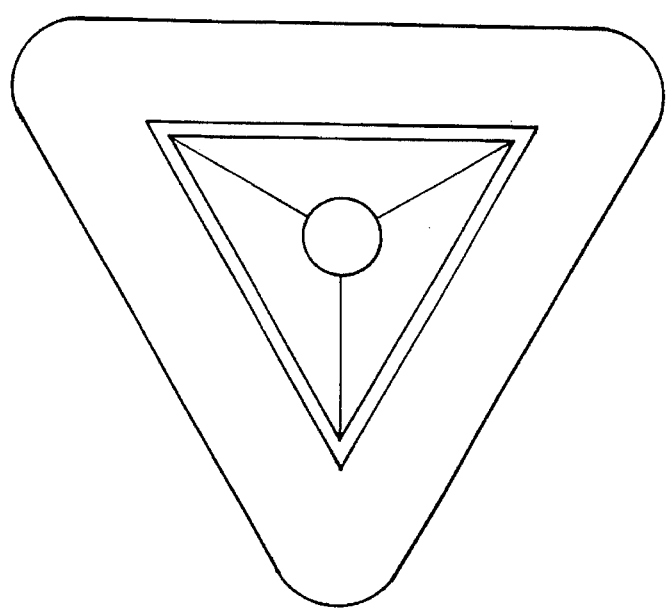

FIG. 8 and FIG. 9 show examples of the tips of the vacuum collet. FIG. 8 demonstrates a conical tip having a conical inner surface. The tip has rotational symmetry. The simple shape facilitates producing the collet. FIG. 9 shows a trigonal pyramid collet having a trigonal pyramid inner wall. Although the shaping is difficult, the trigonal surfaces determine the position of a lens with precision due to three point contacts.

Figure 10:
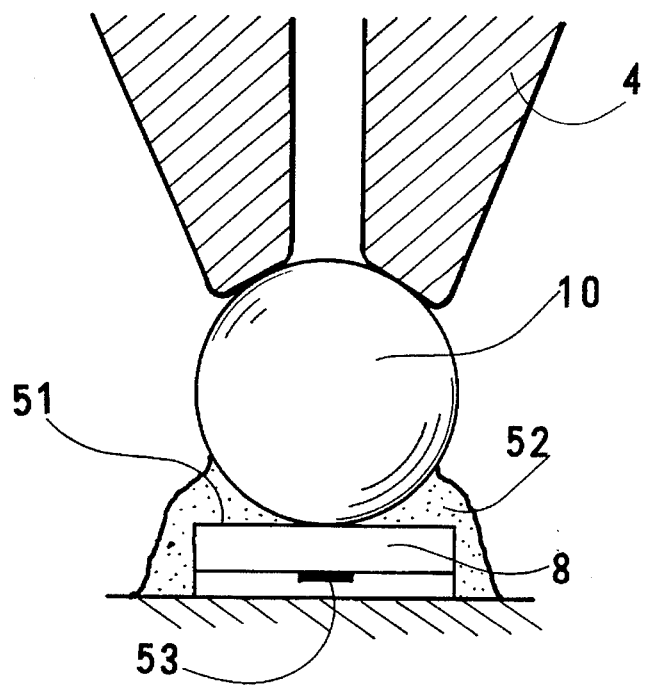
FIG. 10 is a sectional view of a collet, a lens and a chip for demonstrating that the collet holds and pushes the lens down to the chip.

FIG. 10 shows the state in which the vacuum collet (4) pushes the lens (10) against the chip (8). The ball lens (10) is pressed to the main surface (51) of the chip by the collet (4) which still holds the lens. The lens lies (10) just above the emanating region (53). Part of the ultraviolet hardening resin is excluded by the ball lens from the main surface. The bottom of the lens is in contact with the main surface. No resin remains between the main surface and the lens. Other part of the resin encloses the sides of the chip. The pn-junction is protected by the resin. The ultraviolet hardening resin fulfills the role of a passivation film.

Figure 11:
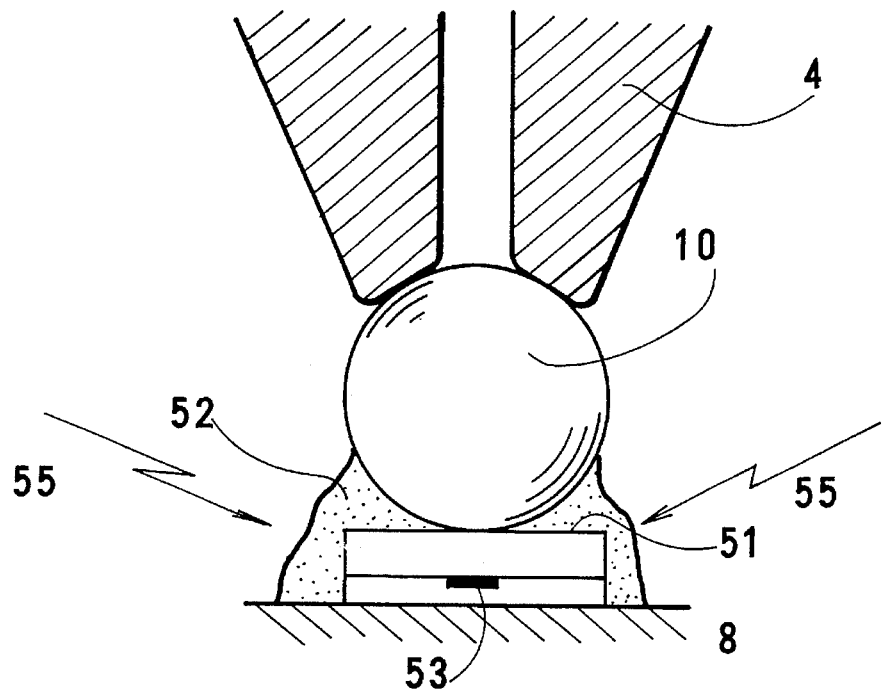
FIG. 11 is a sectional view of a collet, a lens and a chip for showing that the resin is hardened by the irradiation of ultraviolet rays and the lens is kept by the collet.
Figure 12:
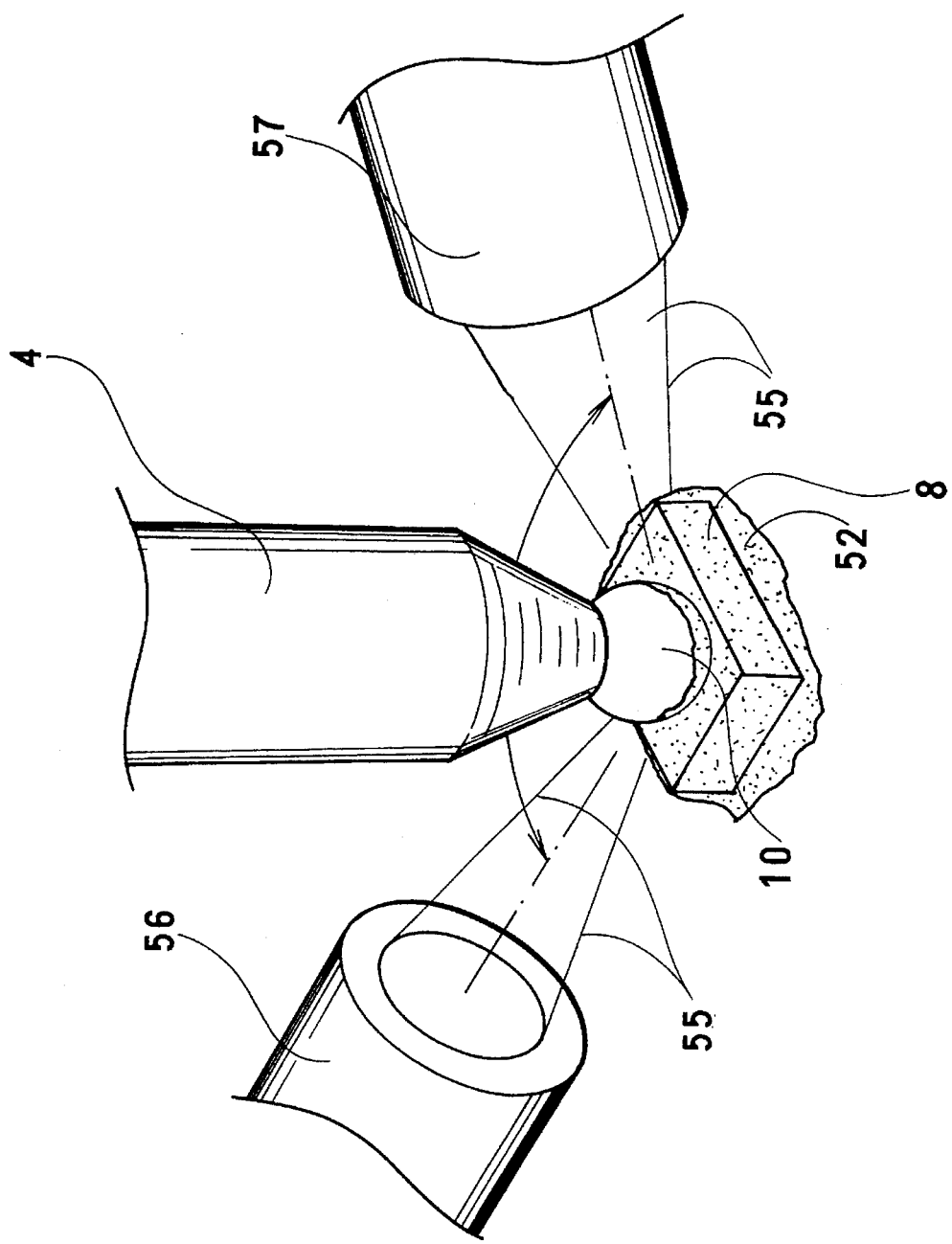
FIG. 12 is a perspective view of the collet keeping the lens against the chip and the resin irradiated by the ultraviolet rays from the irradiation heads.

FIG. 11 shows the process of irradiation of ultraviolet rays on the resin. FIG. 12 demonstrates the same process by a perspective view. While the collet keeps pushing the lens against the chip, ultraviolet rays (55) are irradiated in oblique directions to the ultraviolet hardening resin (52). For example, the light of a wavelength of 365 nm of a halogen lamp is used for the ultraviolet rays for stiffening the resin. The time of irradiation is about 5 seconds to 10 seconds. The oblique angle of the irradiation is about 20 degrees to 60 degrees. The existence of the collet gives the upper limit of the inclination angle of the direction of ultraviolet rays. On the contrary, too small inclination angle invites a shortage of irradiation to the resin and a defect of cohesion.

Further, it is preferable to install two ultraviolet ray radiation heads (56) and (57) in order to irradiate the resin from both directions. 90 degrees to 270 degrees is a preferable angle sandwiched by two imaginary lines which are produced by projecting the axes of the ultraviolet ray radiation heads on the horizontal plane. The reason why two lamps are used is overall pervasion of ultraviolet ray on the resin. Employment of two lamps is effective to avoid the occurrence of dead angle for the rays. The lens casts a shadow on the resin. Thus it is preferable to produce the lens by a material which is transparent to the ultraviolet rays. If the lens is opaque to the rays, the orientation of the lamps should be adjusted to allot sufficient light to the resin beneath the lens.

Figure 13:
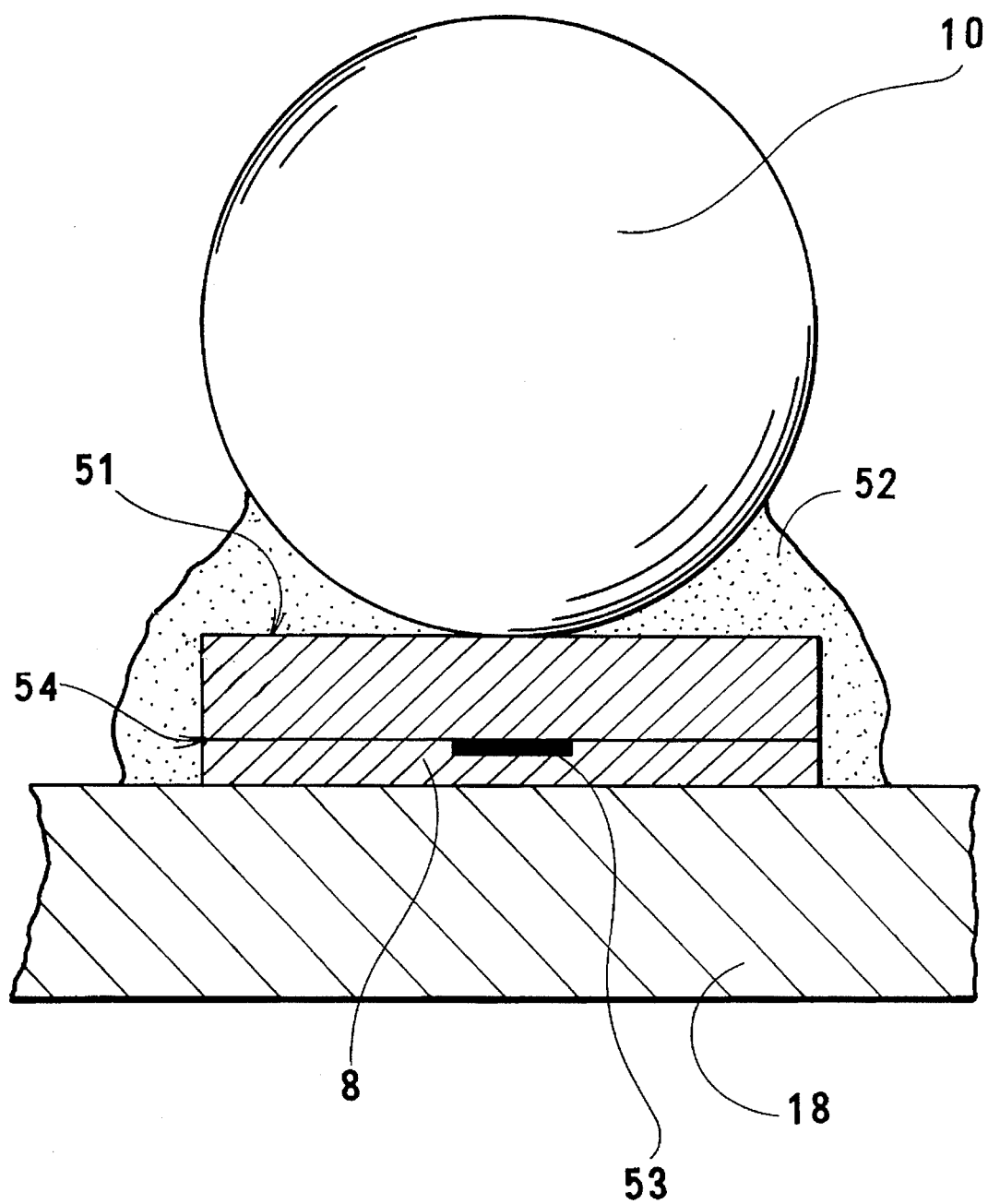
FIG. 13 is a sectional view of the light emitting device (light emitting diode) having a lens above the emanating region.

FIG. 13 is a section of the chip mounted with a lens. A light emitting diode chip (8) is die-bonded with the front surface down on the package (18). A lens (10) rides on the main surface (51) of the chip (8). Ultraviolet ray hardening resin (52) glues the lens (10) to the main surface of the chip (8). The center of the emanating region (53) coincides with the center of the lens in the vertical direction. Ultraviolet ray hardening resin (52) also flows down to the sides of the chip (8) and protects the junction (54). The ball lens is, for example, about 300 µm in diameter. The thickness of chip is around 100 µm to 200 µm. The error in the horizontal direction is less than ±5 µm which is the tolerance of position in the example.

The lens-mounted chip is bonded on the package (18) which is a disk with leads below. A cap with another bigger lens (shot lens) is fitted to the package disc. The inner space is airtightly sealed. The embodiment employs a ball lens. However, the ball lens can be replaced by a cylindrical selfoc lens or convex spherical lens. If another shape of lens is adopted, the collet should have a different inner wall suitable to handle the lens.

What we claim is:

1. A lens mounting method for mounting a lens on a light emitting diode chip having a substrate, epitaxial layers grown on the substrate, a pn-junction made in the epitaxial layers, a confined emanating region formed by the pn-junction, a front surface of the epitaxial layers and a main flat surface of the substrate, and being bonded with the front surface down on a package comprising the steps of:

placing the package on an XY-stage which can move in a horizontal XY-plane;

replenishing a driving current to the device chip;

letting the device chip emit light beams from the emanating region out of the main surface;

observing the emanating region by a camera which can displace in a vertical Z-direction;

finding out the center of the emanating region by an intensity projection method and a gravity measurement method;

harmonizing the center of the emanating region with the center of the camera by moving the XY-stage in the XY-plane;

displacing the XY-stage by a predetermined distance in a predetermined direction to a spot just below a dispenser which can move in Z-direction;

sinking the dispenser till a bottom tip of the dispenser comes into contact with the device chip;

supplying a dose of ultraviolet hardening resin to the chip from the dispenser by contacting the dispenser with the chip;

lifting the dispenser up;

displacing the XY-stage by a predetermined distance in a predetermined direction to a spot Just beneath a vacuum collet holding a lens which can move in Z-direction;

lowering the vacuum collet till the lens comes into contact with the resin and the main surface of the light emitting device chip;

pushing the lens against the chip by the vacuum collet;

irradiating the ultraviolet hardening resin with ultraviolet rays;

fixing the lens on the main surface of the chip by stiffening the resin; and lifting up the vacuum collet from the lens.

2. A lens mounting method as claimed in claim 1, wherein when the dispenser moves down in Z-direction, the dispenser falls quickly at an earlier stage and sinks slowly at a later stage till it comes into contact with the device chip.

3. A lens mounting method as claimed in claim 1, wherein when the vacuum collet having a lens displaces down in Z-direction, the collet falls quickly at an early stage and sinks slowly at a later stage till it comes into contact with the chip.

4. A lens mounting method as claimed in claim 1, wherein the dispenser supplies the main surface of the chip with a sufficient amount of ultraviolet hardening resin to cover sides of the diode chip, and the hardened ultraviolet resin on the sides protects the pn-junction of the device chip.

5. A lens mounting method as claimed in claim 1, wherein the lens is transparent to the ultraviolet light irradiating on the resin.

6. A lens mounting method as claimed in claim 1, wherein two ultraviolet lamps are installed for irradiating the ultraviolet rays on the resin painted on the chip from different directions, the ultraviolet rays incline at 20 degrees to 60 degrees to a horizontal plane, and the projections of the rays on the horizontal plane make a crossing angle of 90 degrees to 270 degrees.

7. A lens mounting method as claimed in claim 1, wherein the dispenser forms a resin ball at the bottom, and the diameter of the resin ball is 500 µm to 700 µm.

8. A lens mounting method as claimed in claim 6, wherein the dose of the ultraviolet hardening resin is $1.0 \times 10^{-5}$ cc to $2.0 \times 10^{-5}$ cc.

9. A lens mounting method as claimed in claim 1, wherein the whole vision of the camera is divided into a pixel matrix consisting of columns and lines, the pixels are allocated with intensity of light values, and the intensity projection method sums the intensity of light values of all the pixels of all lines and the intensity of light values of all the pixels of all columns, and seeks the column and the line which give the maximum sums as a rough estimation of the center of emanation region.

10. A lens mounting method as claimed in claim 9, wherein a confined region is defined with a determined size around the roughly sought center, and the gravity measurement method calculates the center of gravity in two dimensional space, and finds out a rigorous coordinate of the center of the emanation region.

11. A lens mounting method as claimed in claim 1, wherein the tolerance of the error of the lens to the center is ±5 µm.

* * * * *